United States Patent
Na et al.

(10) Patent No.: US 10,082,536 B2
(45) Date of Patent: Sep. 25, 2018

(54) PROBE CARD, THERMAL INSULATION COVER ASSEMBLY FOR PROBE CARD, AND SEMICONDUCTOR DEVICE TEST APPARATUS INCLUDING THE SAME

(71) Applicant: SAMSUNG ELECTRONICS CO., LTD., Suwon-si, Gyeonggi-do (KR)

(72) Inventors: Young-Mi Na, Hwaseong-si (KR); Min-Gu Kim, Yongin-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/145,153

(22) Filed: May 3, 2016

(65) Prior Publication Data
US 2017/0010306 A1    Jan. 12, 2017

(30) Foreign Application Priority Data
Jul. 7, 2015 (KR) .................. 10-2015-0096608

(51) Int. Cl.
*G01R 1/44* (2006.01)
*G01R 1/073* (2006.01)
*G01R 31/28* (2006.01)

(52) U.S. Cl.
CPC ..... *G01R 31/2862* (2013.01); *G01R 31/2863* (2013.01); *G01R 31/2875* (2013.01)

(58) Field of Classification Search
CPC .............................. G01R 1/44; G01R 1/07307
See application file for complete search history.

(56) References Cited

U.S. PATENT DOCUMENTS

| | | | | |
|---|---|---|---|---|
| 3,923,526 A * | 12/1975 | Takashima | ............... | B22D 7/10 |
| | | | | 106/38.22 |
| 4,221,672 A * | 9/1980 | McWilliams | ......... | C04B 14/303 |
| | | | | 219/460.1 |
| 5,108,811 A * | 4/1992 | Shippen | ................. | B32B 27/08 |
| | | | | 428/41.4 |
| 6,354,485 B1 * | 3/2002 | Distefano | ........... | H01L 23/3121 |
| | | | | 228/123.1 |
| 2004/0090223 A1 | 5/2004 | Yonezawa | | |
| 2005/0156613 A1 | 7/2005 | Hosaka | | |
| 2006/0255814 A1 | 11/2006 | Eldridge et al. | | |
| 2007/0284360 A1 * | 12/2007 | Santoruvo | ........... | B01J 19/0093 |
| | | | | 219/439 |

(Continued)

FOREIGN PATENT DOCUMENTS

JP    2000-241454 A    9/2000
JP    2012-178599 A    9/2012

(Continued)

*Primary Examiner* — Minh Phan
*Assistant Examiner* — Zannatul Ferdous
(74) *Attorney, Agent, or Firm* — Lee & Morse, P.C.

(57) ABSTRACT

A probe card includes a circuit substrate to transmit an electrical signal for testing a semiconductor device, a probe block on a lower surface of the circuit substrate, the probe block having a plurality of probes, and a thermal insulation cover assembly on an upper surface of the circuit substrate, the thermal insulation cover assembly covering at least a portion of the circuit substrate and defining a heat receiving space, the thermal insulation cover assembly retaining heat applied to the circuit substrate within the heat receiving space.

15 Claims, 10 Drawing Sheets

(56) References Cited

U.S. PATENT DOCUMENTS

| | | | |
|---|---|---|---|
| 2011/0227602 A1* | 9/2011 | Schmidt | G01R 31/2886 324/762.05 |
| 2011/0291300 A1* | 12/2011 | Hirano | C08F 290/064 257/782 |
| 2013/0069683 A1* | 3/2013 | Kuo | G01R 1/0491 324/755.03 |
| 2014/0239992 A1 | 8/2014 | Lee et al. | |

FOREIGN PATENT DOCUMENTS

| | | |
|---|---|---|
| KR | 10-2004-0038877 A | 5/2004 |
| KR | 10-2005-0076599 A | 7/2005 |
| KR | 10-0632234 B1 | 9/2006 |
| KR | 10-2008-0007612 A | 1/2008 |
| KR | 10-2009-0049892 A | 5/2009 |
| KR | 10-2010-0000264 A | 1/2010 |
| KR | 10-2011-0065069 A | 6/2011 |
| KR | 10-2014-0105897 A | 9/2014 |

* cited by examiner

PROBE CARD, THERMAL INSULATION COVER ASSEMBLY FOR PROBE CARD, AND SEMICONDUCTOR DEVICE TEST APPARATUS INCLUDING THE SAME

CROSS-REFERENCE TO RELATED APPLICATION

Korean Patent Application No. 10-2015-0096608, filed on Jul. 7, 2015, in the Korean Intellectual Property Office, and entitled: "Probe Card, Thermal Insulation Cover Assembly for Probe Card, and Semiconductor Device Test Apparatus Including the Same," is incorporated by reference herein in its entirety.

BACKGROUND

1. Field

Example embodiments relate to a probe card, a thermal insulation cover assembly for a probe card, and a semiconductor device test apparatus. More particularly, example embodiments relate to a probe card used to test electrical properties of a semiconductor device, a thermal insulation cover assembly for a probe card, and a semiconductor device test apparatus including the same.

2. Description of the Related Art

Generally, a semiconductor manufacturing process may include a fabrication (FAB) process for forming a plurality of semiconductor devices, an electric die sorting (EDS) process for testing electrical properties of each of the semiconductor devices formed on a wafer, and an assembly process for dividing the devices that have passed the EDS process into individual chips and packaging the chips to protect the devices from external impacts. During the EDS process a probe card is electrically connected to the fabricated semiconductor devices to test. e.g., inspect, for functional defects, e.g., electrical properties, via electrical signals.

SUMMARY

Example embodiments provide a probe card capable of improving reliability of an electrical property inspection for a semiconductor device.

Example embodiments provide a thermal insulation cover assembly for the probe card.

Example embodiments provide a semiconductor device test apparatus including the probe card.

According to example embodiments, a probe card includes a circuit substrate transmitting an electrical signal for testing a semiconductor device, a probe block provided on a lower surface of the circuit substrate and having a plurality of probes mounted thereon, and a thermal insulation cover assembly provided on an upper surface of the circuit substrate to cover at least a portion of the circuit substrate to form a heat receiving space, and configured to retain heat applied to the circuit substrate within the heat receiving space.

In example embodiments, the thermal insulation cover assembly may include an inner cover having a dome shape to cover at least the portion of the upper surface of the circuit substrate and an outer cover spaced apart from the inner cover to form a thermal insulating space.

In example embodiments, the probe card may further including a connection portion connecting a lower portion of the inner cover and a lower portion of the outer cover each other.

In example embodiments, the outer cover and the inner cover may include stainless steel, reinforced plastic or ceramic.

In example embodiments, the thermal cover assembly may further include a flange fixing a lower portion of the inner cover and a lower portion of the outer cover to the upper surface of the circuit substrate.

In example embodiments, a plurality of recesses may be formed in a lower surface of the flange to be connected to the heat receiving space.

In example embodiments, the recesses may be arranged to be spaced apart from each other in an extending direction of the flange.

In example embodiments, the circuit substrate and the thermal insulation cover assembly may be combined with each other by a fastening bolt coupled to a fastening hole formed in the flange.

In example embodiments, the flange may include an insulation material.

In example embodiments, the thermal insulation cover assembly may further include a first adiabatic layer formed on an outer surface of the outer cover and a second adiabatic layer formed on an inner surface of the inner cover.

In example embodiments, the thermal insulation cover assembly may further include an insulating material interposed between the inner cover and the outer cover.

In example embodiments, the insulating material may include a silica fiber.

In example embodiments, the thermal insulation cover assembly may be detachably mounted on the upper surface of the circuit substrate.

In example embodiments, the thermal insulation cover assembly may be disposed at a position corresponding to the probe block.

According to example embodiments, a thermal insulation cover assembly for probe card includes a thermal insulation cover covering at least a portion of an upper surface of a circuit substrate of a probe card to form a heat receiving space and a flange fixing the thermal insulation cover to the upper surface of the circuit substrate.

In example embodiments, the thermal insulation cover may include an inner cover having a dome shape and an outer cover spaced apart from the inner cover to form a thermal insulating space.

In example embodiments, the outer cover and the inner cover may include stainless steel, reinforced plastic or ceramic.

In example embodiments, a plurality of recesses may be formed in a lower surface of the flange to be connected to the heat receiving space, and the recess may extend in a radial direction of the flange.

In example embodiments, the recesses may be arranged to be spaced apart from each other in a circumferential direction of the flange.

In example embodiments, the recess may extend from an inner side of the flange to an outer side of the flange.

In example embodiments, the flange may include an insulation material.

In example embodiments, the thermal insulation cover assembly may further include a first adiabatic layer formed on an outer surface of the outer cover and a second adiabatic layer formed on an inner surface of the inner cover.

In example embodiments, the thermal insulation cover assembly may further include an insulating material interposed between the inner cover and the outer cover.

In example embodiments, the insulating material may include a silica fiber.

According to example embodiments, a semiconductor device test apparatus includes a prober supporting a device to be tested and providing a space in which an inspection process of the device is performed, a probe card mounted in an upper portion of the prober and configured to contact an electrode pad of the device in order to test electrical properties of the device, and a tester head disposed on the prober, electrically connected to the probe card and transmitting an electrical signal between the probe card and a tester. The probe card includes a circuit substrate mounted in a head plate of an upper portion of the prober and transmitting the electrical signal, a probe block provided on a lower surface of the circuit substrate and having a plurality of probes mounted thereon, and a thermal insulation cover assembly provided on an upper surface of the circuit substrate to cover at least a portion of the circuit substrate to form a heat receiving space and configured to retain heat applied to the circuit substrate within the heat receiving space.

In example embodiments, the thermal insulation cover assembly may include an inner cover having a dome shape to cover at least the portion of the upper surface of the circuit substrate and an outer cover spaced apart from the inner cover to form a thermal insulating space.

In example embodiments, the thermal cover assembly may further include a flange fixing a lower portion of the inner cover and a lower portion of the outer cover to the upper surface of the circuit substrate.

In example embodiments, a plurality of recesses may be formed in a lower surface of the flange to be connected to the heat receiving space.

In example embodiments, the semiconductor device test apparatus may further comprises a loader loading and unloading the device to be tested to the prober.

In example embodiments, the semiconductor device test apparatus may further include a tester outputting an electrical signal for testing the device and receiving an electrical signal from the device to inspect the electrical properties of the device.

According to example embodiments, a probe card may include a circuit substrate to transmit an electrical signal for testing a semiconductor device, a probe block on a lower surface of the circuit substrate, the probe block having a plurality of probes, and a thermal insulation cover assembly on an upper surface of the circuit substrate, the thermal insulation cover assembly defining an empty space between an interior of the thermal insulation cover assembly and the upper surface of the circuit substrate, and the empty space overlapping the probe block.

In example embodiments, the thermal insulation cover assembly may have a dome shape defining the empty space above the upper surface of the circuit substrate, the empty space overlapping the entire probe block.

In example embodiments, the thermal insulation cover assembly may include dome-shaped inner and outer covers spaced apart from each other, a thermal insulating space being defined between the inner and outer covers.

In example embodiments, the probe card may further include a flange between the thermal cover assembly and the upper surface of the circuit substrate, the flange having a ring shape overlapping a bottom of the thermal cover assembly and connecting the bottom of the thermal cover assembly to the upper surface of the circuit substrate.

In example embodiments, the flange may include a plurality of recesses in a lower surface of the flange, each of the plurality of recesses being in fluid communication with the empty space inside the thermal cover assembly and with an exterior of the thermal cover assembly.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
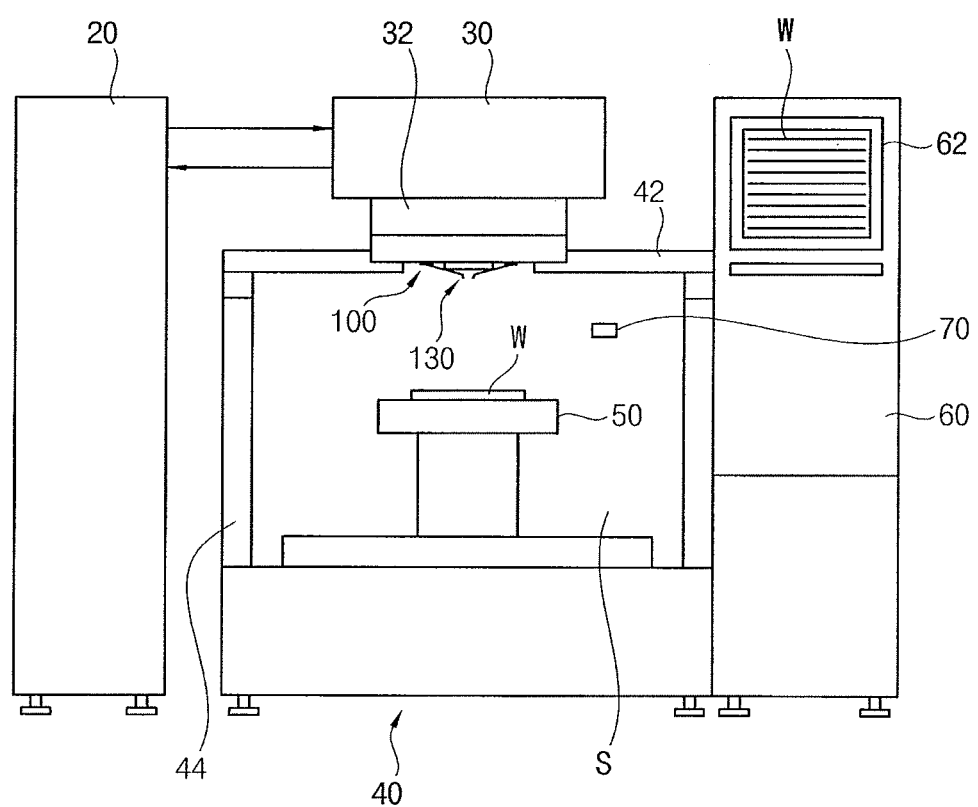
FIG. 1 illustrates a cross-sectional view of a semiconductor device test apparatus in accordance with example embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on," "connected to," or "coupled to" another layer or substrate, it can be directly on, connected to, or coupled to the other layer or substrate, or intervening layers may also be present. In addition, it will also be understood that when a layer is referred to as being "between" two layers, it can be the only layer between the two layers, or one or more intervening layers may also be present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Figure 2:
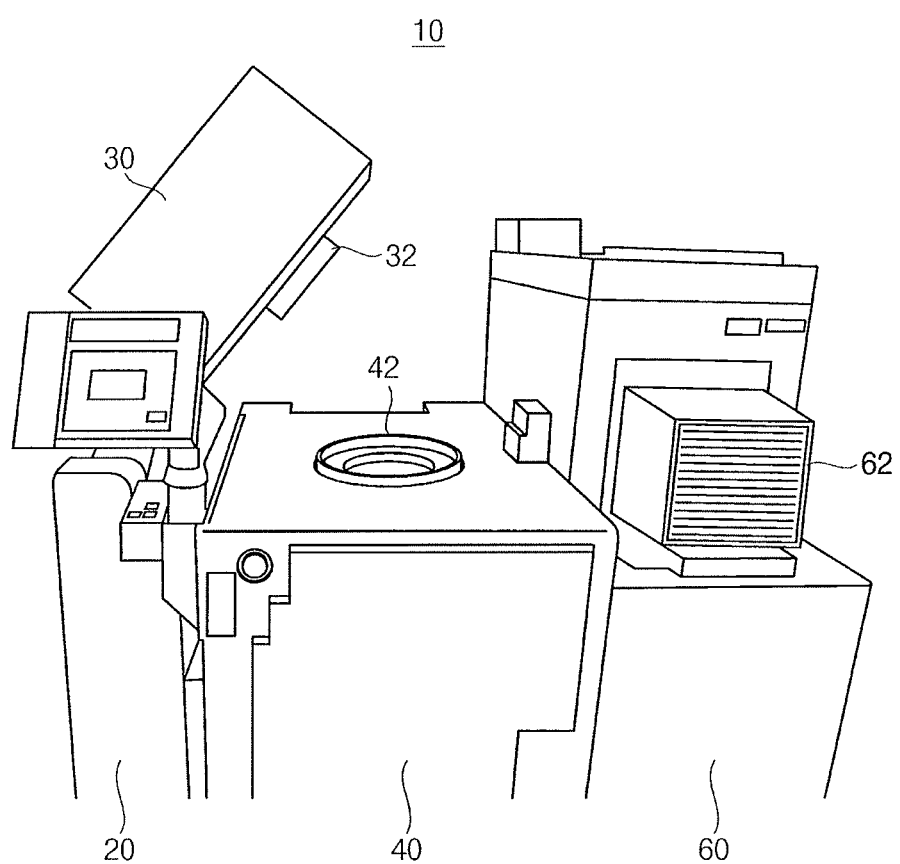
FIG. 2 illustrates a perspective view of the test apparatus in FIG. 1.
Figure 3:
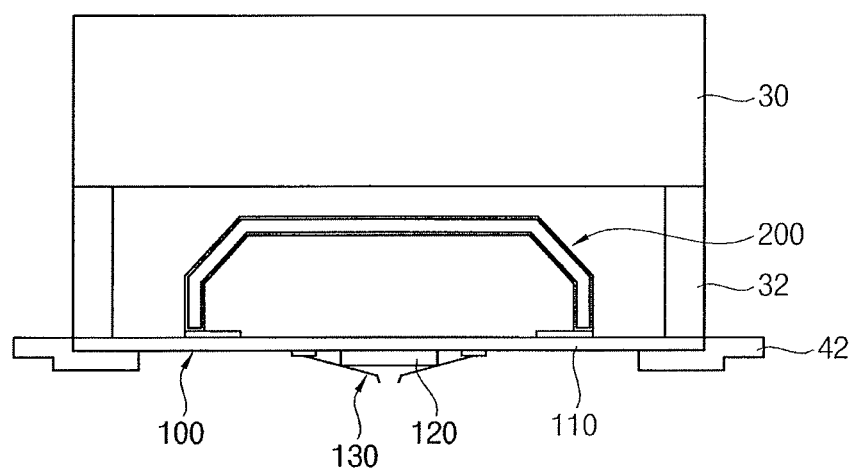
FIG. 3 illustrates a cross-sectional view of a probe card mounted on a prober of the test apparatus in FIG. 2.

FIG. 1 is a cross-sectional view illustrating a semiconductor device test apparatus in accordance with example embodiments. FIG. 2 is a perspective view illustrating the test apparatus in FIG. 1. FIG. 3 is a schematic cross-sectional view illustrating a probe card mounted on a prober of the test apparatus in FIGS. 1-2.

Referring to FIGS. 1 to 3, a semiconductor device test apparatus 10 may include a prober 40 providing a space in which an inspection process of a device under test (DUT) is performed, a probe card 100 mounted on the prober 40, and a tester head 30 disposed on the prober 40 and electrically connected to the probe card 100. Further, the test apparatus 10 may further include a tester 20 and a loader 60.

The loader 60 may be disposed adjacent to the prober 40, e.g., the loader 60 may be at a side of the prober 40. The loader 60 may load and unload the device to be tested, e.g., a wafer W, to the prober 40. The loader 60 may include a substrate receiving portion for supporting a substrate transfer carrier 62, e.g., a front opening universal pod (FOUP) having a plurality of wafers W received therein, and a substrate transfer mechanism for loading the wafer W into a test chamber S of the prober 40 from the substrate receiving portion.

For example, a semiconductor manufacturing process (FAB) may be performed to form semiconductor devices on the wafer W, and the substrate transfer carrier 62 having the wafers W may be transferred to the substrate receiving portion of the loader 60. The substrate transfer mechanism may load the wafer W onto a wafer chuck 50 within the prober 40 from the substrate receiving portion. The substrate transfer mechanism may include a transfer robot for gripping and transferring the substrate, i.e., the wafer W. After performing an inspection process of the substrate, the substrate transfer mechanism may unload the substrate to the substrate receiving portion.

The prober 40 may include a housing 44, e.g., an exterior part to provide the test chamber S therein. The wafer chuck 50 may be disposed within the housing 44 to support the wafer W. The wafer chuck 50 may fix the wafer W to a top surface thereof using, e.g., vacuum absorption. The wafer chuck 50 may be installed on a substrate arranging unit. The substrate arranging unit may move linearly and rotate the wafer chuck 50 in a horizontal direction and a vertical direction. In here, the horizontal direction may be a direction substantially parallel with a flat surface of the wafer, and the vertical direction may be a direction substantially perpendicular to the flat surface of the wafer.

A head plate 42 may be provided in an opening in an upper portion of the housing 44. The probe card 100 may be placed on the head plate 42. For example, as illustrated in FIG. 2, the annular shaped head plate 42 may have a through hole in the middle region, and a step portion may be formed in the through hole. An edge of a circuit substrate 110 of the probe card 100 may be seated and supported on the step portion of the head plate 42 (FIG. 3). Accordingly, as only the edge, e.g., periphery, of the circuit substrate 110 is supported on the step portion of the head plate 42, a majority of a lower surface of the circuit substrate 110 may be exposed through the through hole of the head plate 42. The lower surface of the circuit substrate 110 may face the wafer chuck 50, and an upper surface of the circuit substrate 110 may face the tester head 30.

The wafer W to be tested may be loaded onto the wafer chuck 50 of the prober 40 from the loader 60. The substrate arranging unit may arrange the wafer chuck 50 in the horizontal direction such that electrode pads of the semiconductor device formed on the wafer W may be aligned with probes 130 of the probe card 100. Then, the substrate arranging unit may move the wafer chuck 50 in the vertical direction such that the electrode pads of the semiconductor device may contact the probes 130 of the probe card 100.

The tester 20 may be disposed adjacent to the prober 40, e.g., the tester 20 may be at a side of the prober 40 opposite to the loader 60. The tester 20 may output an electrical signal for testing the DUT, and may receive an electrical signal from the DUT to inspect electrical properties of the DUT. The tester 20 may be electrically connected to the tester head 30.

The tester head 30 may be disposed over the prober 40, and may be electrically connected to the probe card 100 to transmit electrical signals between the probe card 100 and the tester 20. The tester head 30 may ascend and descend over the prober 40, and may be optionally docked with the probe card 100.

The tester head 30 may include various boards adapted for a semiconductor device to be tested. The tester head 30 may include a base 32 directly connected to the probe card 100, e.g., to an upper surface of the circuit substrate 110. The base 32 may have an annular shape along a circumference of a lower portion of the tester head 30. For example, the base 32 may have a ring shape contacting only the edge of the circuit substrate 110, e.g., a portion of the base 32 contacting the circuit substrate 110 may overlap only the step portion of the head plate 42. A pogo block may be provided in the base 32. The pogo block may include a plurality of pogo pins for making contact with conductive patterns 112 (see FIG. 4) which are formed on the upper surface of the circuit substrate 110 of the probe card 100. Accordingly, an electrical signal from the tester 20 may be transmitted to the probe card 100 via the boards of the tester head 30 and the pogo pins of the base 32.

Accordingly, in a state where the probe card 100 is coupled to the base 32 of the tester head 30, the substrate arranging unit may move the wafer chuck 50 to the probe card 100 such that the electrode pads of the semiconductor device on the wafer W make contact with the probes 130 of the probe card 100, respectively. Then, an inspection process may be performed to analyze electrical parameters of the semiconductor device.

In example embodiments, the test apparatus 10 may further include a contact detector 70. The contact detector 70 may be disposed within the test chamber S to inspect a contact between the probe 130 and the electrode pad of the semiconductor device to be tested. For example, a contact mark may be formed in the electrical pad by a physical contact between the probe 130 and the electrode pad, and the contact detector 70 may detect the contact mark to determine whether the contact mark is formed at a desired location.

For example, the contact detector 70 may include a photographing unit, e.g., a direct probe sensor (DPS) camera. The DPS camera may take a picture of a surface of the electrode pad to obtain an image data of the electrode pad. The image data may be analyzed to determine whether the contact mark is defective.

Hereinafter, the probe card 100 will be explained in detail with reference to FIGS. 4-7.

Figure 4:
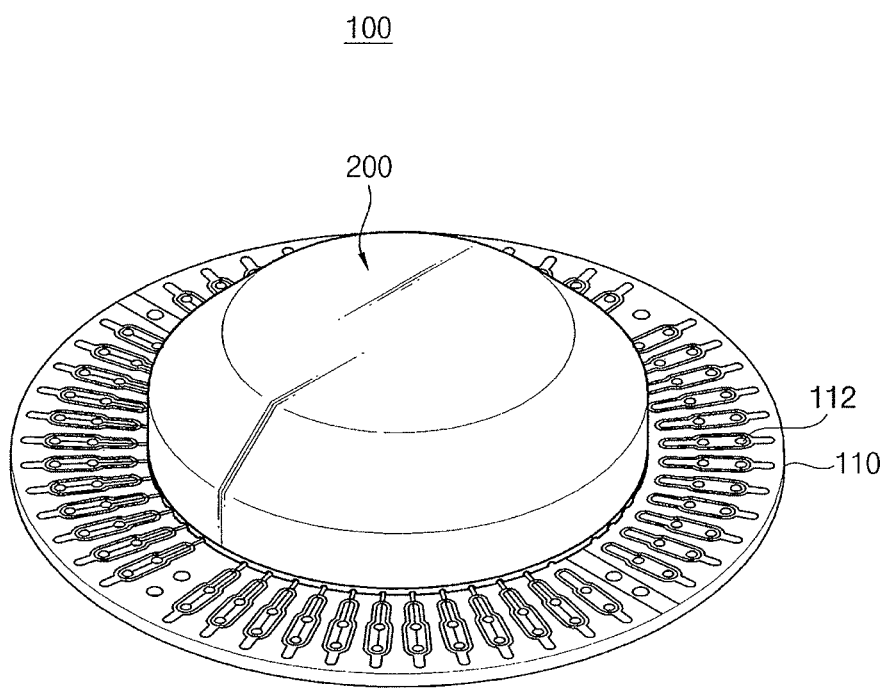
FIG. 4 illustrates a perspective view of a probe card in accordance with example embodiments.
Figure 5:
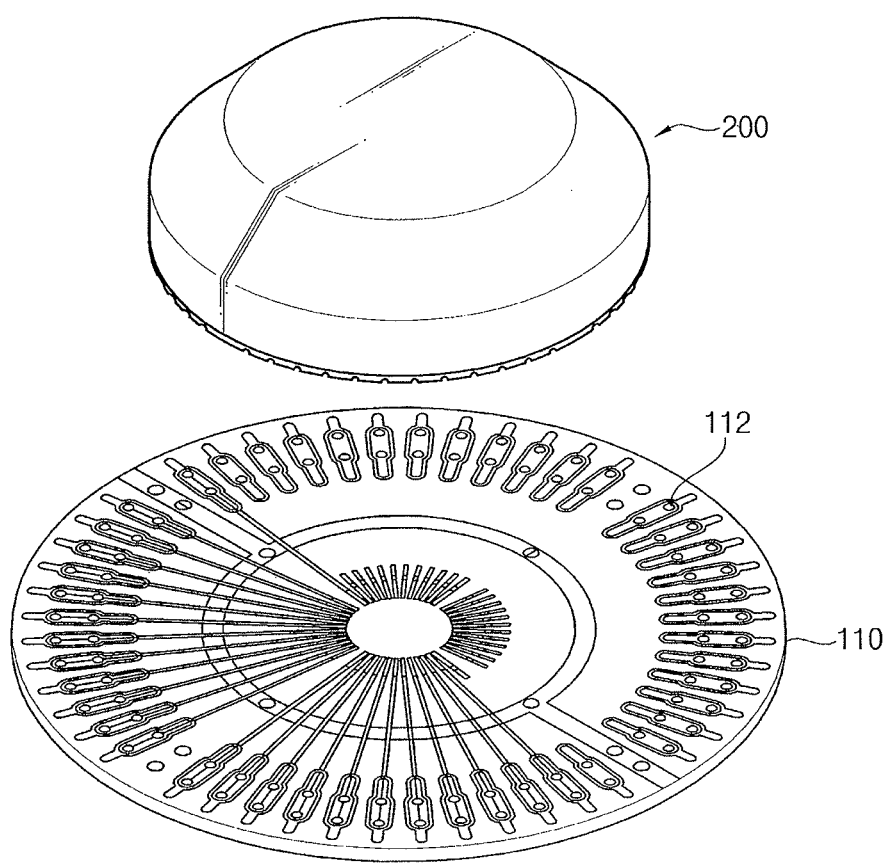
FIG. 5 illustrates an exploded perspective view of the probe card in FIG. 4, with a thermal insulation cover assembly in disassembled condition.
Figure 6:
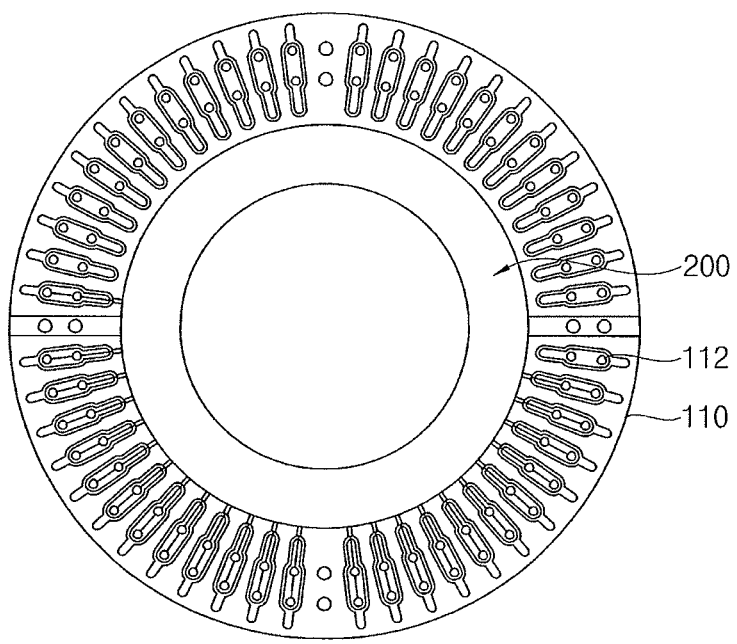
FIG. 6 illustrates a plan view of the probe card in FIG. 4.
Figure 7:
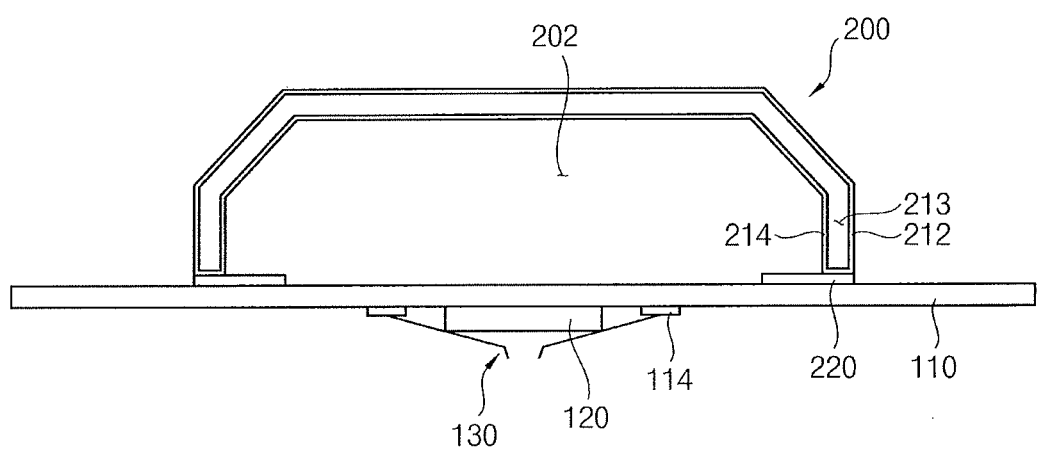
FIG. 7 illustrates a side view of the probe card in FIG. 4.

FIG. 4 is a perspective view illustrating the probe card 100 in accordance with example embodiments. FIG. 5 is an exploded perspective view illustrating the probe card 100 with a thermal insulation cover assembly in a disassembled condition. FIG. 6 is a plan view illustrating the probe card 100, and FIG. 7 is a side view illustrating the probe card 100.

Referring to FIGS. 4 to 7, the probe card 100 may include the circuit substrate 110 transmitting an electrical signal for testing a semiconductor device, a probe block 120 provided on a lower surface of the circuit substrate 110 and having a plurality of probes 130 mounted thereon, and a thermal insulation cover assembly 200 provided on the upper surface of the circuit substrate 110 to cover at least a portion of the circuit substrate 110.

For example, the circuit substrate 110 may have a disk shape. A plurality of conductive patterns 112 for electrical connection with the tester head 30 may be formed on the upper surface of the circuit substrate 110. The conductive patterns 112 may be arranged in a circumferential direction in a peripheral region of the circuit substrate 110, e.g., each conductive pattern 112 may extend radially with respect to a center of the circuit substrate 110 and be spaced apart from an adjacent conductive pattern 112 along the circumferential direction. A plurality of connection pads 114 may be formed on the lower surface of the circuit substrate 110. The connection pads 114 may be electrically connected to the probes 130. The connection pad 114 may be arranged in the circumferential direction around the probe block 120.

The circuit substrate 110 may include channel transmission lines for transmitting the electrical signal. The circuit substrate 110 may include a plurality of wiring layers stacked on one another. The circuit substrate 110 may include a plurality of vias penetrating the wiring layers. Wires formed in the wiring layers and the vias electrically connected to the wires may form the channel transmission lines. The conductive patterns 112 and the connection pads 114 may be electrically connected to each other through the channel transmission lines. The circuit substrate 110 may be formed of glass epoxy resin.

As illustrated in FIG. 7, the probes 130 may be supported on the probe block 120. The probes 130 may extend from the connection pads 114 such that distal ends of the probes 130 protrude from the probe block 120. The probe 130 may have cantilever type needles; however, it may not be limited thereto.

The thermal insulation cover assembly 200 may be detachably mounted on the upper surface of the circuit substrate 110. For example, as illustrated in FIG. 3, the thermal insulation cover assembly 200 may extend from the upper surface of the circuit substrate 110 into a space surrounded by the base 32. The thermal insulation cover assembly 200 may have a semispherical shape, e.g., a dome, to cover at least a portion of the circuit substrate 110. The thermal insulation cover assembly 200 may provide a heat receiving space on the circuit substrate 110. The thermal insulation cover assembly 200 may be disposed at a position corresponding to, e.g., aligned with, the probe block 120. For example, the thermal insulation cover assembly 200 may be arranged to cover, e.g., overlap, the middle region of the circuit substrate 110, e.g., so at least some portions of the conductive patterns 112 on the upper surface of the circuit substrate 110 may be external to the thermal insulation cover assembly 200. Heat transferred from the circuit substrate 110 may be circulated within the heat receiving space of the thermal insulation cover assembly 200, and thus, the probe card 100 may be stabilized in a short time to a constant high temperature, thereby preventing and minimizing continued deformation due to a lasting change in temperature.

Hereinafter, the thermal insulation cover assembly 200 will be explained in detail with reference to FIGS. 8-11.

Figure 8:
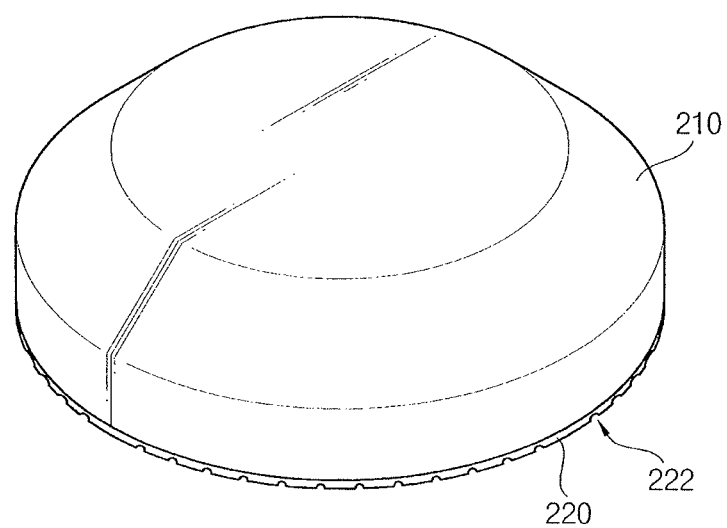
FIG. 8 illustrates a perspective view of a thermal insulation cover assembly for probe card in accordance with example embodiments.
Figure 9:
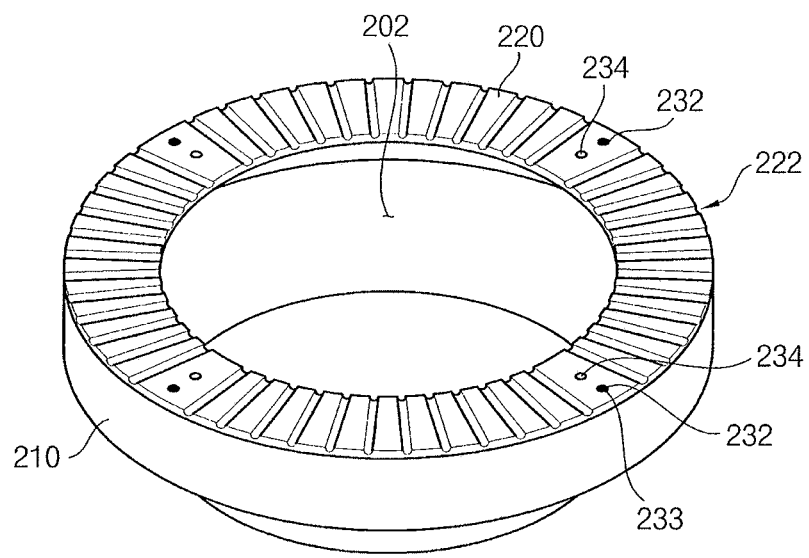
FIG. 9 illustrates a bottom perspective view of a bottom of the thermal insulation cover assembly in FIG. 8.
Figure 10:
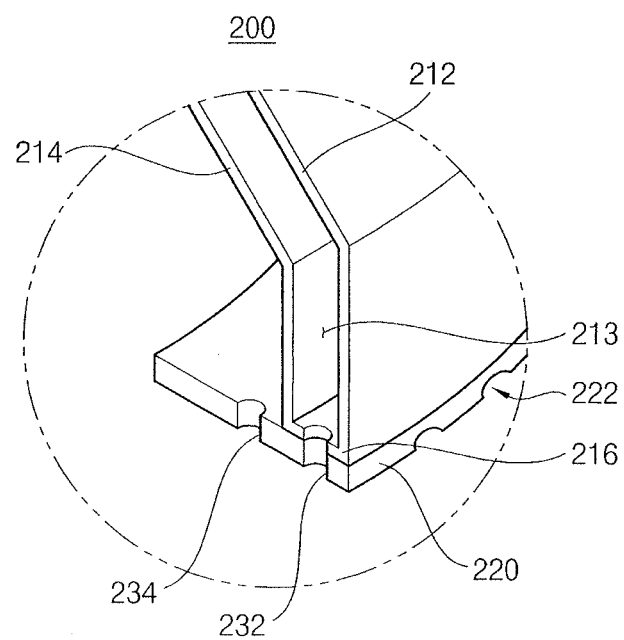
FIG. 10 illustrates an exploded perspective view of a portion of the thermal insulation cover assembly in FIG. 8.
Figure 11:
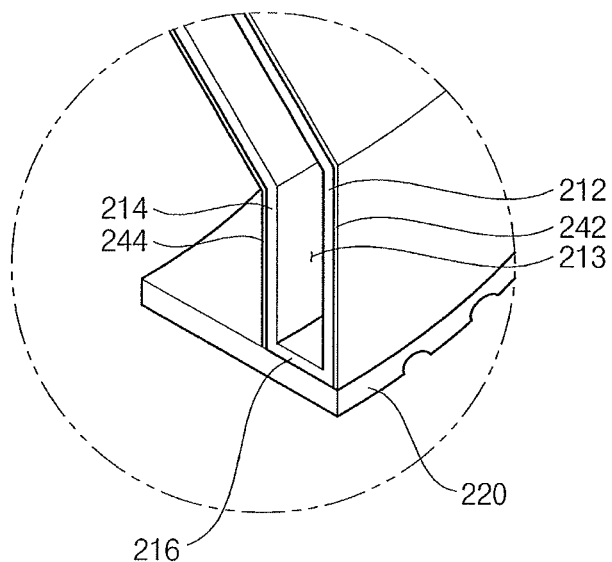
FIG. 11 illustrates a view of the thermal insulation cover assembly in FIG. 10 with first and second adiabatic layers.

FIG. 8 is a perspective view of the thermal insulation cover assembly 200. FIG. 9 is a bottom perspective view of a bottom of the thermal insulation cover assembly 200. FIG. 10 is an exploded perspective view of a portion of the thermal insulation cover assembly 200. FIG. 11 is a view of the thermal insulation cover assembly 200 with first and second adiabatic layers.

Referring to FIGS. 8 to 11, the thermal insulation cover assembly 200 may include a thermal insulation cover 210 covering at least a portion of the upper surface of the circuit substrate 110 of the probe card 100 to form, e.g., define, a heat receiving space 202, and a flange 220 fixing the thermal insulation cover 210 to the upper surface of the circuit substrate 110.

In example embodiments, as illustrated in FIG. 7, the thermal insulation cover 210 may include an inner cover 214 having a dome shape to cover at least a portion of the upper surface of the circuit substrate 110, and an outer cover 212 spaced apart from the inner cover 214 to form a thermal insulating space 213 therebetween, e.g., the thermal insulating space 213 may surround the inner cover 214. For example, the thermal insulating space 213 may be an air gap. For example, as illustrated in FIG. 7, the inner and outer covers 214 and 212 may have same shapes, and may have a constant distance therebetween. For example, as illustrated in FIG. 7, each of the inner and outer covers 214 and 212 may include a supporting portion having an annular shape, a sidewall portion extending in a vertical direction from the supporting portion, and an upper cover covering the sidewall portion.

As illustrated in FIG. 10, the thermal insulation cover 210 may further include a connection portion 216 connecting a lower portion of the inner cover 214 and a lower portion of the outer cover 212 to each other. Accordingly, the outer cover 212, the inner cover 214, and the connection portion 216 may form, e.g., define, the thermal insulating space 213 therebetween.

The outer cover 212 and the inner cover 214 may include a material having an excellent heat insulation property. For example, the outer cover 212 and the inner cover 214 may include stainless steel, reinforced plastic, ceramic, etc. The material selected as the thermal insulation cover, e.g., stainless steel, may have excellent corrosion resistance, thermal resistance, weldability, formability, etc.

The flange 220 may be disposed under the supporting portion of the thermal insulation cover 210. The flange 220 may have an annular shape (FIG. 9). For example, the flange 220 may include an insulation material, e.g., Teflon®.

A plurality of recesses 222 may be formed in a lower surface of the flange 220, e.g., in a surface of the flange 220 facing the circuit substrate 110. The plurality of recesses 222 may be connected to, e.g., in fluid communication with, the heat receiving space 202. The recesses 222 may be arranged to be spaced apart from each other in a circumferential direction of the flange 220. The recess 222 may extend from an inner side of the flange 220 to an outer side of the flange 220. The recess 222 may extend in a radial direction of the flange 220.

The recess 222 may be a tunnel recess that connects the heat receiving space 202 of the thermal insulation cover assembly 200 to the outside. Cool air may be introduced into the heat receiving space 202 through the recess 222 of the flange 220 from the outside of the thermal insulation cover assembly 200, and the cool air may be circulated in the heat receiving space 202 such that the heat receiving space 202 may be stabilized and maintained at a constant temperature.

The thermal insulation cover 210 may be fixed on the flange 220, and the flange 220 may be detachably combined with the circuit substrate 110 of the probe card 100 by a fastening member, e.g., a bolt. A first fastening hole 232 may be formed in the flange 220, and the connection portion 216 of the thermal insulation cover 210 may be combined with the flange 220 by a fastening bolt 233 screw-coupled to the first fastening hole 232. A second fastening hole 234 may be formed in the flange 220, and the circuit substrate 110 may be combined with the flange 220 by a fastening bolt screw-coupled to the second fastening hole 234.

Alternatively, the thermal insulation cover 210 may not include the connection portion 216, and the outer cover 212 or the inner cover 214 may be coupled with the flange 220 or the circuit substrate 110 by a mounting bracket.

As illustrated in FIG. 1, the thermal insulation cover assembly 200 may further include a first adiabatic layer 242 formed on an outer surface of the outer cover 212 and a second adiabatic layer 244 formed on an inner surface of the inner cover 214. The first and second adiabatic layers 242 and 244 may include an adiabatic material, e.g., ceramic. Thus, the outer cover 212 having the first adiabatic layer 242 coated thereon may block cool air from the outside and the inner cover 214 having the second adiabatic layer 244 coated thereon may prevent heat from escaping from the heat receiving space 202 to the outside. Further, cool air introduced into the heat receiving space 202 through the recess 222 of the flange 220 may be circulated convectively by thermal current to rapidly increase the temperature of the heat receiving space 202 up to a constant temperature corresponding to a temperature of a heat source.

Figure 12:
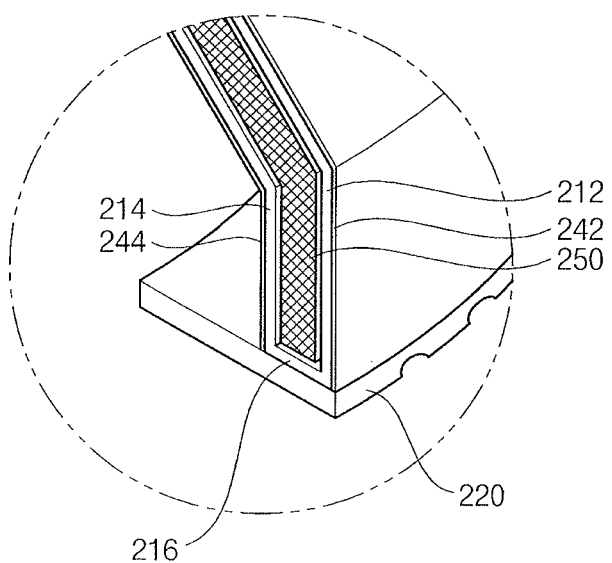
FIG. 12 illustrates an exploded perspective view of a portion of a thermal insulation cover assembly in accordance with example embodiments.

FIG. 12 is an exploded perspective view illustrating a portion of a thermal insulation cover assembly in accordance with example embodiments. The thermal insulation cover assembly may be substantially the same as or similar to the thermal insulation cover assembly in FIG. 11, except that the thermal insulation cover assembly may further include an insulating material. Thus, same reference numerals will be used to refer to the same or like elements, and any further repetitive explanation concerning the above elements will be omitted.

Referring to FIG. 12, a thermal insulation cover assembly may include the thermal insulation cover 210 covering a portion of the upper surface of the circuit substrate 110 of the probe card 100 to form the heat receiving space 202, and the flange 220 fixing the thermal insulation cover 210 to the upper surface of the circuit substrate 110. In example embodiments, the thermal insulation cover 210 may include the inner cover 214 having a dome shape to cover at least a portion of the upper surface of the circuit substrate 110, the outer cover 212 spaced apart from the inner cover 214 to form the thermal insulating space 213, and an insulating material 250 interposed between the inner cover 214 and the outer cover 212 in the thermal insulating space 213.

For example, the insulating material 250 may include a silica fiber. The insulating material 250 may block a radiation heat transfer from the inside or the outside.

Figure 13:
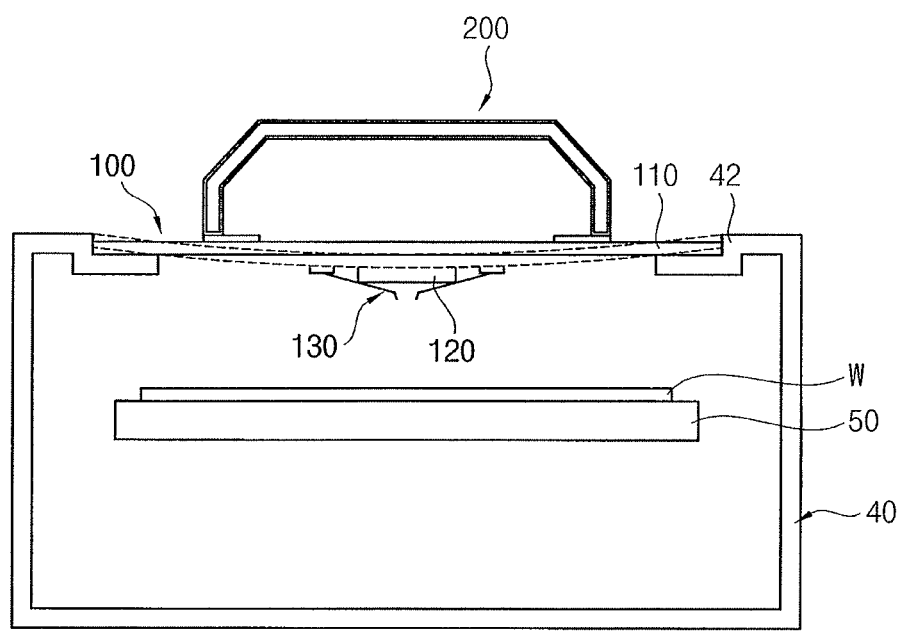
FIG. 13 illustrates a cross-sectional view of an inspection process of a semiconductor device using a probe card in accordance with example embodiments.
Figure 14:
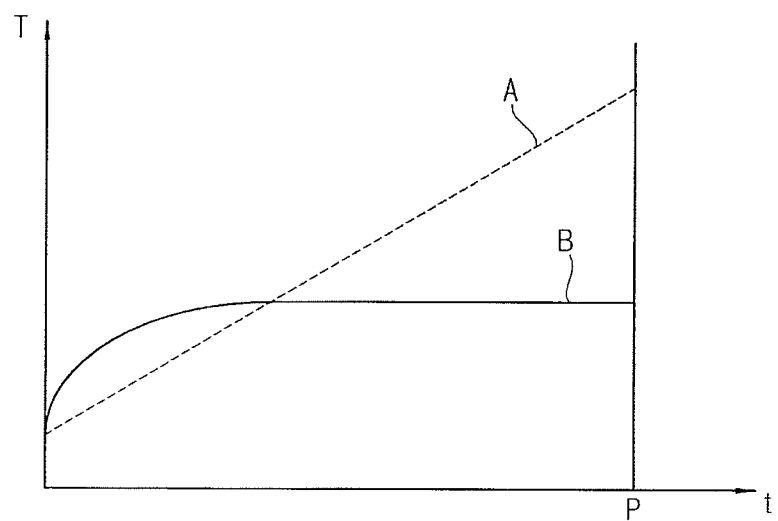
FIG. 14 illustrates a graph of a temperature change of the probe card detected while performing the inspection process in FIG. 13.

FIG. 13 is a cross-sectional view illustrating an inspection process of a semiconductor device using the probe card 100. FIG. 14 is a graph illustrating temperature change of the probe card 110 while performing the inspection process in FIG. 13.

Referring to FIGS. 1, 13 and 14, while a long duration temperature property analysis may be performed using the semiconductor device test apparatus 10, the probe card 100 may be deformed by heat transferred from the wafer chuck 50.

In detail, a high temperature inspection process may be performed under a temperature of, e.g. about 85° C. to about 125° C. As the long duration inspection process proceeds, the heat deformation may occur lastingly, and thus, the probe card 110 may be bent, e.g., a central region of the probe card 110 may be deformed downward (dashed lines in FIG. 13).

Referring to FIG. 14, in Graph A, i.e., where the circuit substrate 110 is not covered by a thermal insulation cover assembly, the temperature (T) of the probe card 110 may be increased continuously during the inspection process, and thus, the deformation of the probe card 110 may be increased continuously. As such, the position of the probe card 110 may be changed continuously. Accordingly, whenever the contact inspections are performed repeatedly for hours, a contact position between the electrode pad of the wafer and the probe card 110 may be changed each time due to the continued deformation of the probe card, and thus, a contact failure may occur.

In contrast, referring to Graph B, i.e., where the circuit substrate 110 is covered by the thermal insulation cover assembly 200 according to embodiments, the thermal insulation cover assembly 200 may define the heat receiving space 202 above the circuit substrate 110, such that the temperature of the circuit substrate 110 may be increased in a short time and maintained at a constant temperature, thereby minimizing the continued thermal deformation. That is, the heat transferred to the circuit substrate 110 may not be emitted to the outside but may be retained in the heat receiving space to rapidly stabilize the circuit substrate up to a constant temperature corresponding to a temperature of a heat source (wafer chuck) so that the circuit substrate 110 may be deformed to a predicted position. Accordingly, a contact failure between the wafer and the probe may be prevented.

For example, the temperature of the probe card may be increased and maintained at a constant high temperature within the first ten to twenty seconds of the total time (for example, 1 hour) of inspection. Accordingly, even though the contact inspections are performed repeatedly several times, because the deformation of the probe card may be constant due to the constant high temperature, a contact position between the electrode pad of the wafer and the probe may not be changed.

The probe card having the thermal insulation cover assembly may be applied to an EDS process. Semiconductor devices, e.g., dynamic random-access memory (DRAM), VNAND, etc., manufactured using the EDS process may be used for various systems, e.g., a computing system. The computing system may be applied to, e.g., a computer, a portable computer, a laptop computer, a personal digital assistant (PDA), a tablet, a mobile phone, a digital music player, etc.

By way of summation and review, a contact force and a contact position between a wafer and a probe of a probe card may act as an important factor in an electronic die sorting (EDS) process. However, while a long temperature property analysis is performed using a semiconductor device test apparatus, deformation of the probe card may be increased by heat transferred from a wafer chuck. Accordingly, the contact positions between the wafer and the probe (of the deformed probe card) may be different whenever contact inspections are performed, so that a contact failure may occur.

In contrast, according to example embodiments, a probe card may include a thermal insulation cover assembly which covers at least a portion of an upper surface of a circuit substrate to form a heat receiving space. The thermal insulation cover assembly may retain heat applied to the circuit substrate within the heat receiving space to increase and maintain the temperature of the circuit substrate in a short time to a constant high temperature, thereby preventing and minimizing continued deformation due to a lasting change in temperature of the circuit substrate.

Accordingly, the heat transferred to the circuit substrate may not be emitted to the outside but may be retained in the heat receiving space to rapidly stabilize the circuit substrate up to a constant temperature corresponding to a temperature of a heat source so that the circuit substrate may be deformed to a predicted position. Thus, a contact failure between a wafer and a device to be tested may be prevented.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A probe card, comprising:
a circuit substrate to transmit an electrical signal for testing a semiconductor device;
a probe block on a lower surface of the circuit substrate, the probe block having a plurality of probes; and
a thermal insulation cover assembly on an upper surface of the circuit substrate, the thermal insulation cover assembly covering at least a portion of the circuit substrate and defining a heat receiving space, the thermal insulation cover assembly retaining heat applied to the circuit substrate within the heat receiving space,
wherein the heat receiving space is an empty space enclosed between the upper surface of the circuit substrate and an interior surface of the thermal insulation cover that faces the upper surface of the circuit substrate, and
wherein the thermal insulation cover assembly includes:
an inner cover having a dome shape to cover at least the portion of the upper surface of the circuit substrate, the inner cover being the interior surface of the thermal insulation cover that faces the upper surface of the circuit substrate,
an outer cover spaced apart from the inner cover, a thermal insulating space being defined between the inner and outer covers, and
a flange fixing a lower portion of the inner cover and a lower portion of the outer cover to the upper surface of the circuit substrate, the flange including a plurality of recesses in a lower surface of the flange, and the plurality of recesses being in fluid communication with the heat receiving space.

2. The probe card as claimed in claim 1, further comprising a connection portion connecting a lower portion of the inner cover and a lower portion of the outer cover to each other.

3. The probe card as claimed in claim 1, wherein the thermal insulation cover assembly further comprises:
a first adiabatic layer on an outer surface of the outer cover; and
a second adiabatic layer on an inner surface of the inner cover.

4. The probe card as claimed in claim 1, wherein the thermal insulation cover assembly further comprises an insulating material between the inner cover and the outer cover.

5. The probe card as claimed in claim 1, wherein the thermal insulation cover assembly is detachably mounted on the upper surface of the circuit substrate.

6. A thermal insulation cover assembly for a probe card, the thermal insulation cover assembly comprising:
a non-flat thermal insulation cover covering at least a portion of an upper surface of a circuit substrate of a probe card to define a heat receiving space; and
a flange fixing the thermal insulation cover to the upper surface of the circuit substrate,
wherein the flange includes a plurality of recesses in a lower surface of the flange, the plurality of recesses extending in a radial direction of the flange, and being in fluid communication with the heat receiving space, and
wherein the plurality of recesses are spaced apart from each other in a circumferential direction of the flange.

7. The thermal insulation cover assembly as claimed in claim 6, wherein the thermal insulation cover includes:
an inner cover having a dome shape; and
an outer cover spaced apart from the inner cover to define a thermal insulating space.

8. The thermal insulation cover assembly as claimed in claim 7, further comprising:
a first adiabatic layer on an outer surface of the outer cover; and
a second adiabatic layer on an inner surface of the inner cover.

9. The thermal insulation cover assembly as claimed in claim 7, further comprising an insulating material between the inner cover and the outer cover, the insulating material includes a silica fiber.

10. The thermal insulation cover assembly as claimed in claim 6, wherein each recess of the plurality of recesses extends from an inner side of the flange to an outer side of the flange.

11. The thermal insulation cover assembly as claimed in claim 6, wherein the flange includes an insulation material.

12. A probe card, comprising:
a circuit substrate to transmit an electrical signal for testing a semiconductor device;
a probe block on a lower surface of the circuit substrate, the probe block having a plurality of probes;
a thermal insulation cover assembly on an upper surface of the circuit substrate, the thermal insulation cover assembly defining an empty space between an interior of the thermal insulation cover assembly and the upper surface of the circuit substrate, and the empty space overlapping the probe block; and
a flange between the thermal insulation cover assembly and the upper surface of the circuit substrate, the flange having a ring shape overlapping a bottom of the thermal insulation cover assembly and connecting the bottom of the thermal insulation cover assembly to the upper surface of the circuit substrate,
wherein the thermal insulation cover assembly has a closed dome shape defining the empty space above the upper surface of the circuit substrate, the empty space overlapping the entire probe block.

13. The probe card as claimed in claim 12, wherein the thermal insulation cover assembly includes dome-shaped inner and outer covers spaced apart from each other, a thermal insulating space being defined between the inner and outer covers.

14. The probe card as claimed in claim 12, wherein the flange includes a plurality of recesses in a lower surface of the flange, each of the plurality of recesses being in fluid communication with the empty space inside the thermal insulation cover assembly and with an exterior of the thermal insulation cover assembly.

15. The probe card as claimed in claim 6, wherein a portion of the thermal insulation cover extends away from the upper surface of the circuit substrate, the heat receiving space being an empty space enclosed between the upper surface of the circuit substrate and the portion of the thermal insulation cover.

* * * * *